(12) United States Patent
Zheng

(10) Patent No.: US 11,361,579 B2
(45) Date of Patent: Jun. 14, 2022

(54) OPTICAL FINGERPRINT RECOGNITION CIRCUIT AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Yuan Zheng, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 123 days.

(21) Appl. No.: 16/762,954

(22) PCT Filed: Dec. 11, 2019

(86) PCT No.: PCT/CN2019/124635
§ 371 (c)(1),
(2) Date: May 11, 2020

(87) PCT Pub. No.: WO2021/077569
PCT Pub. Date: Apr. 29, 2021

(65) Prior Publication Data
US 2021/0406504 A1    Dec. 30, 2021

(30) Foreign Application Priority Data
Oct. 22, 2019    (CN) .......................... 201911007021.5

(51) Int. Cl.
*G06V 40/13*    (2022.01)
*G06V 10/98*    (2022.01)
(Continued)

(52) U.S. Cl.
CPC .......... *G06V 40/1318* (2022.01); *G06V 10/98* (2022.01); *H01L 27/14616* (2013.01); *H01L 29/78672* (2013.01)

(58) Field of Classification Search
CPC .. G06K 9/0004; G06K 9/03; H01L 27/14616; H01L 29/78672; G06V 40/1318; G06V 10/98; G09G 3/20
See application file for complete search history.

(56) References Cited

U.S. PATENT DOCUMENTS

2018/0189538 A1* 7/2018 He .................. G06K 9/0002

FOREIGN PATENT DOCUMENTS

CN    110097038 A  *  8/2019

* cited by examiner

*Primary Examiner* — Abhishek Sarma

(57) ABSTRACT

An optical fingerprint recognition circuit and a display device are provided, which includes a first thin film transistor, a first switching unit, a second switching unit, a reset compensation unit, a storage capacitor, and a photodiode. The reset compensation unit resets a voltage of the gate of the first thin film transistor under the control of a reset signal, and the voltage is set to a sum of a predetermined voltage and a threshold voltage of the first thin film transistor through a reference voltage under the control of the reset signal, thereby compensating the threshold voltage. After the photodiode receives the light signal and changes the voltage according to the light signal, the first thin film transistor generates a corresponding current according to the voltage of its gate, which is independent of the threshold voltage. The accuracy of a recognition signal is ensured.

8 Claims, 13 Drawing Sheets

(51) Int. Cl.
*H01L 27/146* (2006.01)
*H01L 29/786* (2006.01)

OPTICAL FINGERPRINT RECOGNITION CIRCUIT AND DISPLAY DEVICE

FIELD OF INVENTION

This disclosure relates to a field of display technology, and more particularly to an optical fingerprint recognition circuit and a display device.

BACKGROUND OF INVENTION

Optical fingerprint recognition technology, such as fingerprint lock, fingerprint attendance and other applications, has been integrated into people's daily life as a mature fingerprint recognition technology.

With continuous development of technology, a screen-body ratio of mobile terminals, such as mobile phones, is getting higher. Full-screen mobile terminals have become a development trend. For the fingerprint recognition of the full-screen mobile terminals, the popularity of in-screen fingerprint recognition is getting higher, which makes the optical fingerprint recognition reattract people's attention. At present, most of optical recognition sensors for in-screen fingerprint recognition are silicon-based sensors. However, the cost of silicon-based sensors is high. This makes fingerprint recognition modules with such optical recognition sensors expensive.

The cost of thin film transistor (TFT) using low temperature polysilicon (LTPS) technology is relatively low. The LTPS thin film transistors can also be used to implement optical fingerprint sensor circuit construction, which can effectively reduce the price of the fingerprint identification module using the optical fingerprint identification technology. Referring to FIG. 1, a circuit diagram of a conventional optical fingerprint recognition circuit based on the LTPS thin film transistor is shown. The optical fingerprint recognition circuit includes a first thin film transistor T10, a second thin film transistor T20, a capacitor C10, and a photodiode D10. A gate of the first thin film transistor T10 is electrically connected to a anode of the photodiode D1, a power supply voltage Vdd is received by a drain, and a source is electrically connected to a source of the second thin film transistor T20. A switching signal SW1 is received by a gate of the second thin film transistor T20, and a drain is electrically connected to the signal transmission terminal READOUT. One end of the capacitor C10 receives the power supply voltage Vdd, and the other end is electrically connected to the gate of the first thin film transistor T10. A diode bias voltage DBIAS is received by a cathode of the photodiode D10. During operation, a scanning signal SW controls the second thin film transistor T20 to be turned on, and the reflective light of a finger exposes the photodiode D10. The photodiode D10 receives an optical signal and generates a leakage current, so that a voltage of the gate of the first thin film transistor T10 is changed correspondingly. The first thin film transistor T10 generates a current corresponding to the optical signal according to its gate voltage to serve as a recognition signal, and transmits it to the signal transmission terminal READOUT for output, thereby achieving fingerprint recognition. However, the LTPS thin film transistor has a drawback of uneven threshold voltage, so that a final output recognition signal is affected by the uneven threshold voltage of the first thin film transistor T10, thereby reducing the accuracy of the signal recognition.

SUMMARY OF INVENTION

An object of the disclosure is to provide an optical fingerprint recognition circuit for compensating a threshold voltage of a first thin film transistor to ensure accuracy of the signal recognition.

An object of the disclosure is to provide a display device, the optical fingerprint recognition circuit is configured for compensating a threshold voltage of a first thin film transistor to ensure accuracy of the signal recognition.

To achieve the above object, the disclosure provides an optical fingerprint recognition circuit, which includes a first thin film transistor, a first switching unit, a second switching unit, a reset compensation unit, a storage capacitor and a photodiode;

the first switching unit receives a scanning signal and a power supply voltage, and is configured to transmit the power supply voltage to one of a source and a drain of the first thin film transistor under the control of the scanning signal;

the second switching unit receives a scanning signal, and is configured to electrically connect the other of the source and the drain of the first thin film transistor with a signal transmission terminal under the control of the scanning signal;

one end of the storage capacitor is connected to receive the power supply voltage, and the other end of the storage capacitor is electrically connected to a gate of the first thin film transistor;

the reset compensation unit receives a reference voltage and a reset signal for resetting a voltage of the gate of the first thin film transistor under the control of the reset signal, and wherein the voltage of the gate of the first thin film transistor is set to a sum of a predetermined voltage value and a threshold voltage of the first thin film transistor through the reference voltage under the control of the reset signal; and one of an anode and a cathode of the photodiode is connected to receive a diode bias voltage, and the other one of the anode and the cathode is electrically connected to the gate of the first thin film transistor for receiving a light signal and changing the voltage of the gate of the first thin film transistor correspondingly according to the light signal.

The first switching unit comprises a fourth thin film transistor, a gate of the fourth thin film transistor is connected to receive the scanning signal, a source of the fourth thin film transistor is connected to receive the power supply voltage, and a drain of the fourth thin film transistor is electrically connected to one of the source and the drain of the first thin film transistor; and the second switching unit comprises a fifth thin film transistor, a gate of the fifth thin film transistor is connected to receive the scanning signal, a source of the fifth thin film transistor is electrically connected to the other one of the source and the drain of the first thin film transistor, and a drain is electrically connected to the signal transmission terminal.

The reset compensation unit comprises a second thin film transistor and a third thin film transistor, a gate of the second thin film transistor is connected to receive the reset signal, a source of the second thin film transistor is electrically connected to the drain of the first thin film transistor, a drain of the second thin film transistor is electrically connected to the gate of the first the thin film transistor, a gate of the third thin film transistor is connected to receive the reset signal, a source of the third thin film transistor is connected to receive the reference voltage, a drain of the third thin film transistor is electrically connected to the source of the first thin film transistor, the drain of the fourth thin film transistor is electrically connected to the drain of the first thin film transistor, and the source of the fifth thin film transistor is electrically connected to the source of the first thin film transistor.

The first thin film transistor, the second thin film transistor, the third thin film transistor, the fourth thin film transistor, and the fifth thin film transistor are all N-type thin film transistors.

The cathode of the photodiode is connected to receive the diode bias voltage, and the anode of the photodiode is electrically connected to the gate of the first thin film transistor.

An operation process of the optical fingerprint recognition circuit comprises a reset stage, a threshold compensation stage, an exposure stage, and a data reading stage in sequence.

In the reset stage, the scan signal is at a high-potential level to control the fourth thin film transistor and the fifth thin-film transistor to be turned on, the reset signal is at a high-potential level to control the second thin film transistor and the third thin-film transistor to be turned on, and the voltage of the first thin-film transistor is the power supply voltage.

In the threshold compensation stage, the scan signal is at a low-potential level to control the fourth thin film transistor and the fifth thin film transistor to be turned off, the reset signal is at a high-potential level to control the second thin film transistor and the third thin film transistor to be turned on, a voltage of the reference voltage is the predetermined voltage, the predetermined voltage is lower than the power supply voltage, the voltage of the gate of the first thin film transistor is continuously reduced until it is equal to VRef+Vth, and wherein VRef is the predetermined voltage value and Vth is the threshold voltage of the first thin film transistor, the diode bias voltage is greater than VRef+Vth.

In the exposure stage, the scan signal is at a low-potential level to control the fourth thin film transistor and the fifth thin film transistor to be turned off, the reset signal is at a low-potential level to control the second thin film transistor and the third thin film transistor to be turned off, the photodiode receives the light signal and produce leakage current, so that the voltage of the gate of the first thin film transistor is increased to VRef+Vth+ΔV, and wherein ΔV is an increase amount of the voltage of the gate of the first thin film transistor caused by the leakage current of the photodiode due to receiving a light signal.

In the data reading stage, the scan signal is at a high-potential level to control the fourth thin film transistor and the fifth thin film transistor to be turned on, the reset signal is at a low-potential level to control the second thin film transistor and the third thin film transistor to be turned off, the first thin film transistor generates a corresponding current according to the voltage of the gate of the first thin film transistor, so that the corresponding current is transmitted to the signal transmission terminal through the fifth thin film transistor that is turned on.

In the reset stage, a voltage value of the reference voltage is equal to a voltage value of the power supply voltage.

The reset compensation unit comprises a second thin film transistor and a third thin film transistor, a gate of the second thin film transistor is connected to receive the reset signal, a source of the second thin film transistor is electrically connected to a gate of the first thin film transistor, a drain of the second thin film transistor is electrically connected to the drain of the first thin film transistor, a gate of the third thin film transistor is connected to receive a reset signal, a source of the third thin film transistor is connected to receive the reference voltage, a drain of the third thin film transistor is electrically connected to the source of the first thin film transistor, a drain of the fourth thin film transistor is electrically connected to the source of the first thin film transistor, and the source of the fifth thin film transistor is electrically connected to the drain of the first thin film transistor.

The first thin film transistor, the second thin film transistor, the third thin film transistor, the fourth thin film transistor, and the fifth thin film transistor are all P-type thin film transistors.

The anode of the photodiode is connected to receive a diode bias voltage, and the cathode of the photodiode is electrically connected to the gate of the first thin film transistor.

An operation process of the optical fingerprint recognition circuit comprises a reset stage, a threshold compensation stage, an exposure stage, and a data reading stage in sequence.

In the reset stage, the scan signal is at a high-potential level to control the fourth thin film transistor and the fifth thin-film transistor to be turned on, the reset signal is at a high-potential level to control the second thin film transistor and the third thin-film transistor to be turned on, the signal transmission terminal is connected to receive a ground terminal voltage, and the voltage of the first thin-film transistor is the ground terminal voltage.

In the threshold compensation stage, the scan signal is at a high-potential level to control the fourth thin film transistor and the fifth thin film transistor to be turned off, the reset signal is at a low-potential level to control the second thin film transistor and the third thin film transistor to be turned on, a voltage of the reference voltage is the predetermined voltage, the predetermined voltage is greater than the ground terminal voltage, the voltage of the gate of the first thin film transistor is continuously increased until it is equal to VRef'+Vth', and wherein the VRef' is the predetermined voltage value and the Vth' is the threshold voltage of the first thin film transistor, the diode bias voltage is less than VRef'+Vth'.

In the exposure stage, the scan signal is at a high-potential level to control the fourth thin film transistor and the fifth thin film transistor to be turned off, the reset signal is at a high-potential level to control the second thin film transistor and the third thin film transistor to be turned off, the photodiode receives the light signal and produce leakage current, so that the voltage of the gate of the first thin film transistor is reduced to VRef'+Vth'−ΔV', and wherein ΔV' is an reduction amount of the voltage of the gate of the first thin film transistor caused by the leakage current of the photodiode due to receiving a light signal.

In the data reading stage, the scan signal is at a low-potential level to control the fourth thin film transistor and the fifth thin film transistor to be turned on, the reset signal is at a high-potential level to control the second thin film transistor and the third thin film transistor to be turned off, the first thin film transistor generates a corresponding current to be transmitted to the signal transmission terminal through the fifth thin film transistor that is turned on according to the voltage of the gate of the fifth thin film transistor.

In the reset stage, a voltage value of the reference voltage is equal to a voltage value of the ground terminal voltage.

The first thin film transistor, the second thin film transistor, the third thin film transistor, the fourth thin film transistor, and the fifth thin film transistor are all LTPS thin film transistors.

The disclosure further provides a display device comprising the above-mentioned optical fingerprint recognition circuit.

Advantageous effects of the disclosure are as follows. The disclosure provides an optical fingerprint recognition circuit, which includes a first thin film transistor, a first switching unit, a second switching unit, a reset compensation unit, a storage capacitor and a photodiode. The reset compensation unit resets a voltage of the gate of the first thin film transistor under the control of a reset signal, and the voltage of the gate of the first thin film transistor is set to a sum of a predetermined voltage and a threshold voltage of the first thin film transistor through a reference voltage under the control of the reset signal, thereby compensating the threshold voltage of the first thin film transistor. After the photodiode receives the light signal and changes the voltage of the first thin film transistor according to the light signal, the first thin film transistor generates a corresponding current according to the voltage of its gate, which is independent of the threshold voltage of the first thin film transistor. Therefore, the accuracy of a recognition signal is ensured. The fingerprint recognition circuit of the display device of the disclosure can compensate the threshold voltage of the first thin film transistor to ensure the accuracy of the recognition signal.

DESCRIPTION OF DRAWINGS

In order to more clearly illustrate the embodiments of the disclosure or the technical solutions in the prior art, the following briefly introduces the accompanying drawings used in the embodiments. However, the drawings are only provided for reference and description, and are not intended to limit the scope of the disclosure.

DETAILED DESCRIPTION OF PREFERRED EMBODIMENTS

In order to further explain the technical solutions and effects adopted by the disclosure, the following description is a detailed description in combination with the preferred embodiment of the disclosure and the accompanying drawings.

Figure 1:
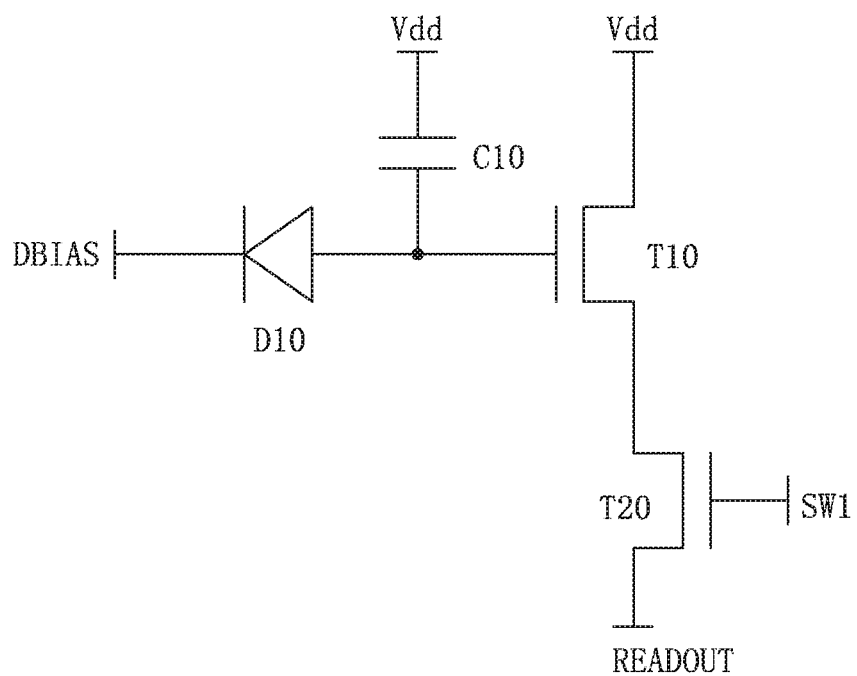
FIG. 1 is a circuit schematic diagram of a conventional optical fingerprint recognition circuit.
Figure 2:
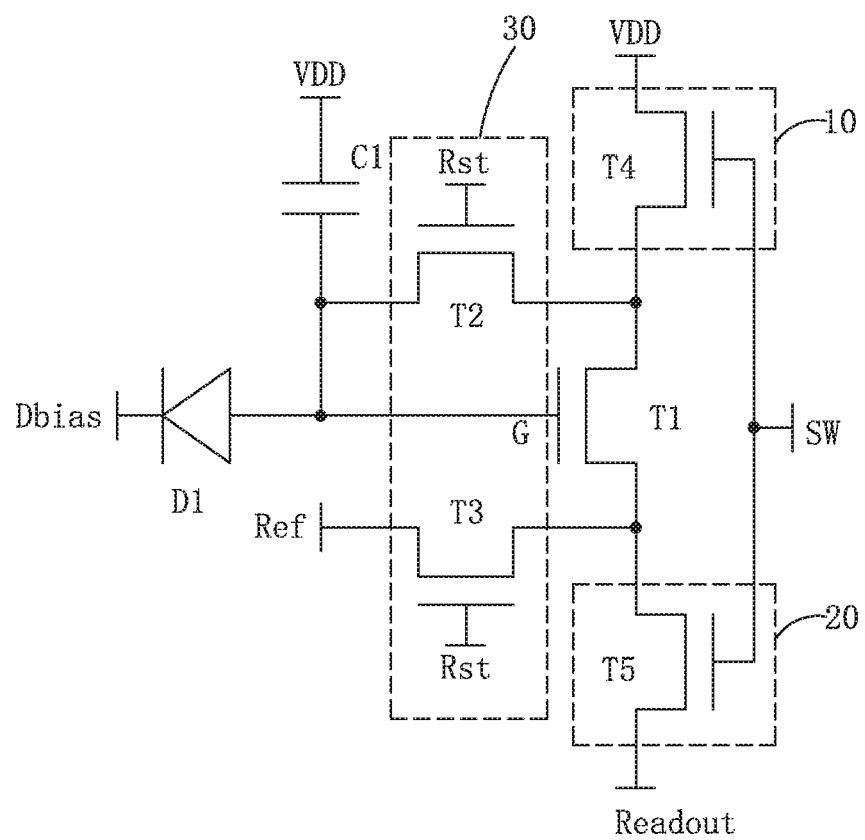
FIG. 2 is a circuit schematic diagram of an optical fingerprint recognition circuit according to a first embodiment of the disclosure.

Referring to FIG. 2, a first embodiment of the disclosure provides an optical fingerprint recognition circuit, which includes a first thin film transistor T1, a first switching unit 10, a second switching unit 20, a reset compensation unit 30, a storage capacitor C1 and a photodiode D1.

The first switching unit 10 receives a scanning signal SW and a power supply voltage VDD, and is configured to transmit the power supply voltage VDD to one of a source and a drain of the first thin film transistor T1 under the control of the scanning signal.

The second switching unit 20 receives a scanning signal SW, and is configured to electrically connect the other of the source and the drain of the first thin film transistor T1 with a signal transmission terminal Readout under the control of the scanning signal.

One end of the storage capacitor C1 is connected to receive the power supply voltage VDD, and the other end of the storage capacitor C1 is electrically connected to a gate G of the first thin film transistor T1.

The reset compensation unit 30 receives a reference voltage Ref and a reset signal Rst for resetting a voltage of the gate of the first thin film transistor under the control of the reset signal Rst, and then the voltage of the gate G of the first thin film transistor T1 is set to a sum of a predetermined voltage value and a threshold voltage of the first thin film transistor T1 through the reference voltage Ref under the control of the reset signal Rst.

One of an anode and a cathode of the photodiode D1 is connected to receive a diode bias voltage Dbias, and the other one of the anode and the cathode is electrically connected to the gate G of the first thin film transistor T1 for receiving a light signal and changing the voltage of the gate G of the first thin film transistor T1 correspondingly according to the light signal.

Specifically, referring to FIG. 2, in the first embodiment of the disclosure, the first switching unit 10 includes a fourth thin film transistor T4. A gate of the fourth thin film transistor T4 is connected to receive the scanning signal SW, the source is connected to receive the power supply voltage VDD, and the drain is electrically connected to the drain of the first thin film transistor T1. The second switching unit 20 includes a fifth thin film transistor T5. A gate of the fifth thin film transistor T5 is connected to receive the scanning signal SW, a source of the fifth thin film transistor is electrically connected to the source of the first thin film transistor T1, and the drain of the fifth thin film transistor is electrically connected to the signal transmission terminal Readout.

Specifically, referring to FIG. 2, in the first embodiment of the disclosure, the reset compensation unit 30 includes a second thin film transistor T2 and a third thin film transistor T3. A gate of the second thin film transistor T2 receives the reset signal Rst, a source is electrically connected to the drain of the first thin film transistor T1, and a drain is electrically connected to the gate G of the first thin film transistor T1. A gate of the third thin film transistor T3 receives the reset signal Rst, a source receives the reference voltage Ref, and a drain is electrically connected to the source of the first thin film transistor T1.

Specifically, in the first embodiment of the disclosure, the first thin film transistor T1, the second thin film transistor T2, the third thin film transistor T3, the fourth thin film transistor T4, and the fifth thin film transistor T5 are all N-type thin film transistors.

Preferably, the first thin film transistor T1, second thin film transistor T2, third thin film transistor T3, fourth thin film transistor T4, and fifth thin film transistor T5 are all LTPS thin film transistors.

Specifically, referring to FIG. 2, in a first embodiment of the disclosure, a cathode of the photodiode D1 receives a diode bias voltage Dbias, and a anode is electrically connected to the gate G of the first thin film transistor T1.

Specifically, the signal transmission terminal Readout is electrically connected to a processing chip (not shown).

Figure 3:
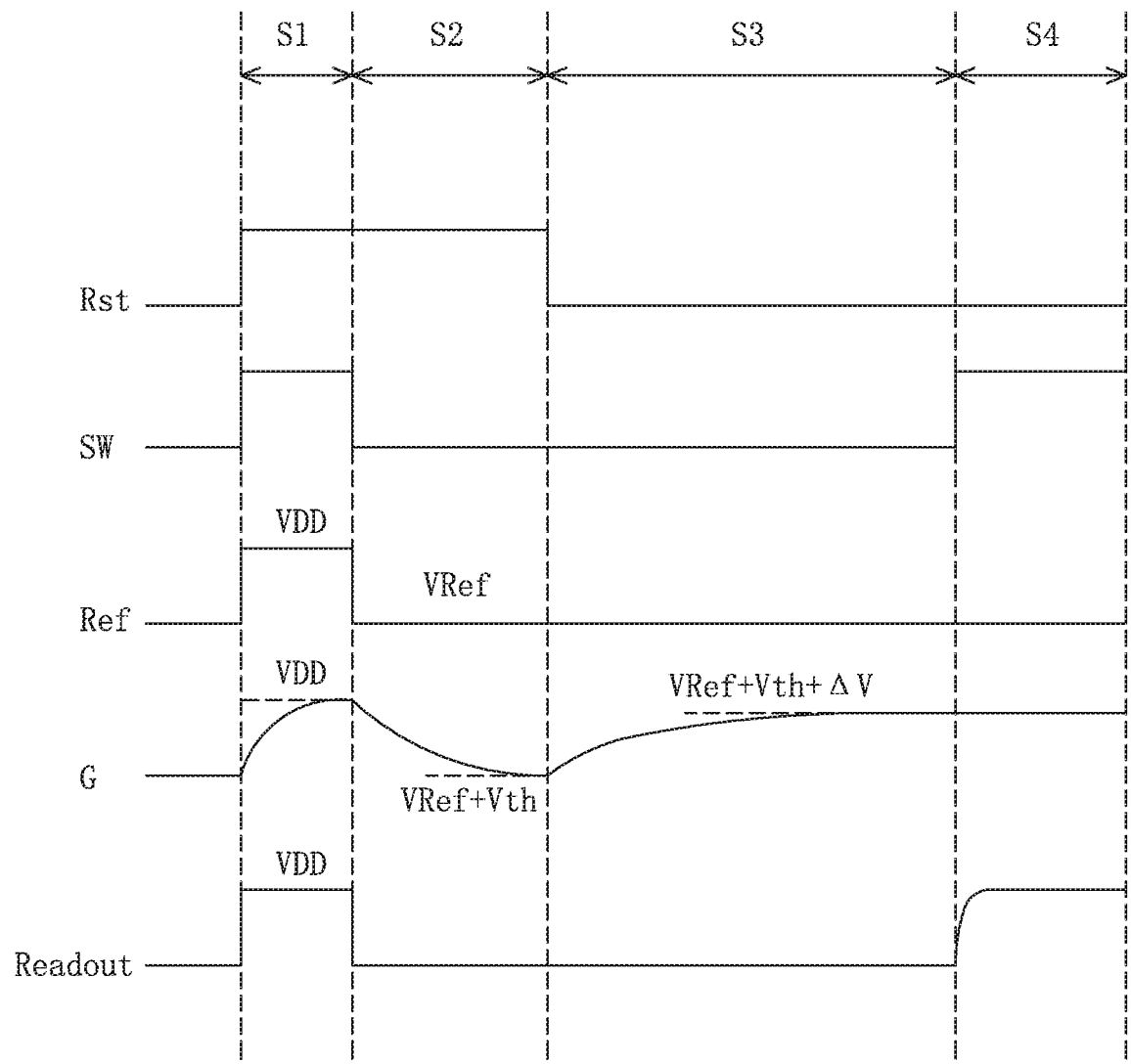
FIG. 3 is a timing schematic diagram of an optical fingerprint recognition circuit according to the first embodiment of the disclosure.

Specifically, referring to FIG. 3, in the first embodiment of the disclosure, an operation process of the optical fingerprint recognition circuit comprises a reset stage S1, a threshold compensation stage S2, an exposure stage S3, and a data reading stage in sequence S4.

Figure 4:
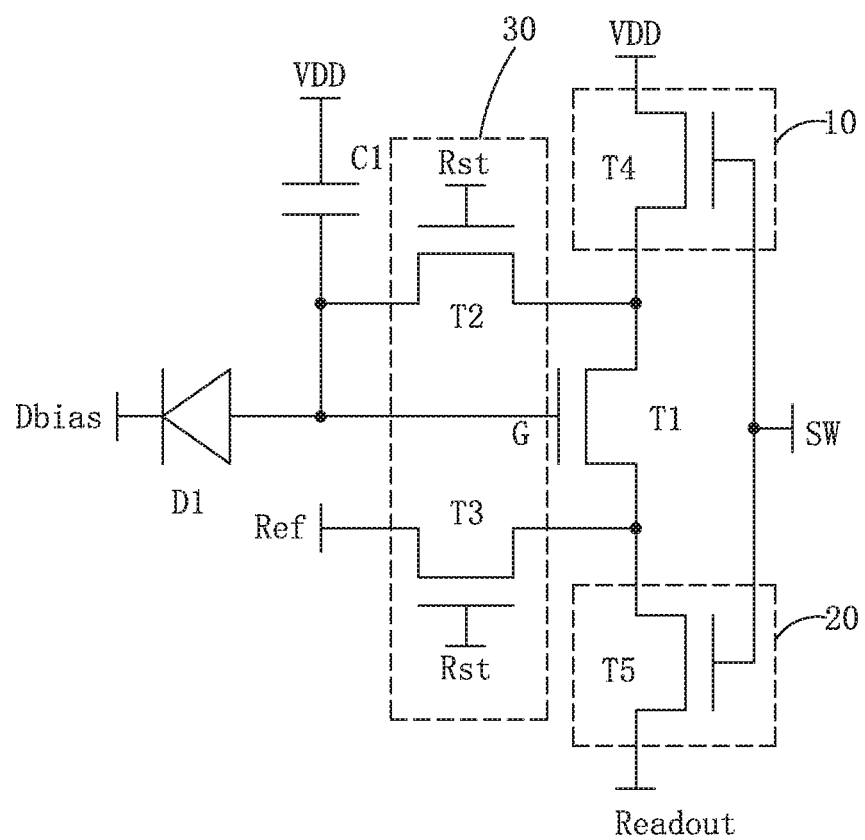
FIG. 4 is a schematic diagram of the optical fingerprint recognition circuit in a reset stage according to the first embodiment of the disclosure.

Referring to FIG. 3 and FIG. 4, in the reset stage S1, the scan signal SW is at a high-potential level to control the fourth thin film transistor T4 and the fifth thin-film transistor T5 to be turned on, the reset signal Rst is at a high-potential level to control the second thin film transistor T2 and the third thin-film transistor T3 to be turned on. At this time, the gate of the first thin film transistor T1 is connected to receive the power supply voltage VDD through the turned-on second thin film transistor T2 and the fourth thin film transistor T4, so that the voltage of the gate G of the first thin film transistor T1 is the power supply voltage VDD. The gate G of the first thin film transistor T1 is reset, and the voltage at the signal transmission terminal Readout is also the power supply voltage VDD.

Preferably, in the reset stage S1, the voltage value of the reference voltage Ref is equal to the power supply voltage VDD, so as to prevent the problem of excessive current.

Figure 5:
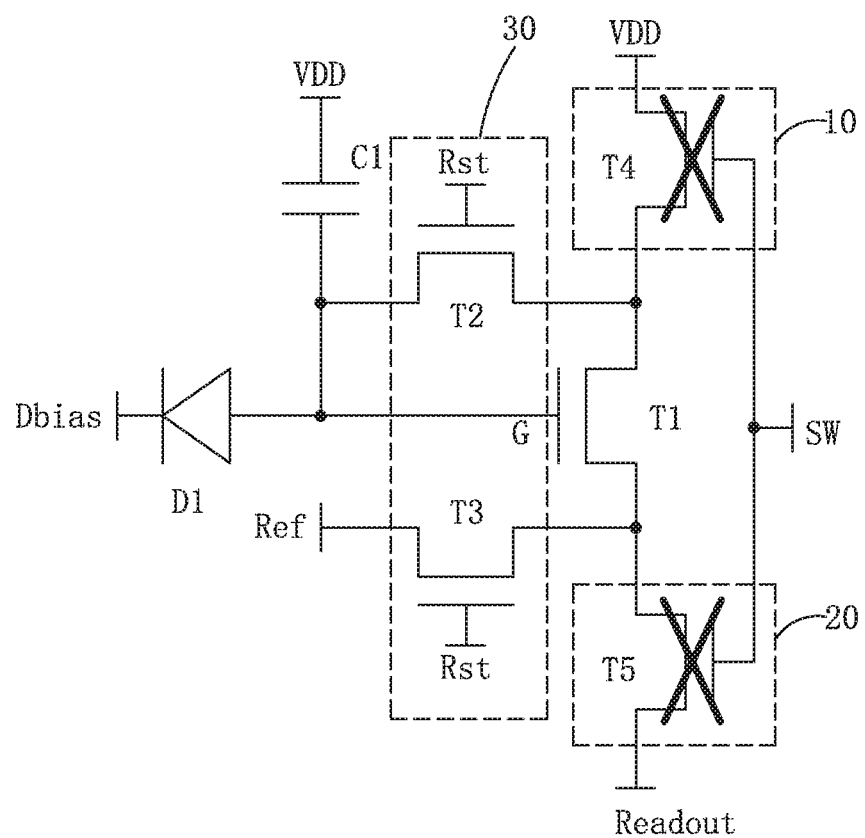
FIG. 5 is a schematic diagram of the optical fingerprint recognition circuit in a threshold compensation stage according to the first embodiment of the disclosure.

Referring to FIG. 3 in combination with FIG. 5, in the threshold compensation stage S2, the scan signal SW is at a low-potential level to control the fourth thin film transistor T4 and the fifth thin film transistor T5 to be turned off, the reset signal Rst is at a high-potential level to control the second thin film transistor T2 and the third thin film transistor T3 to be turned on. A voltage of the reference voltage Ref is the predetermined voltage VRef, the predetermined voltage VRef is lower than the power supply voltage VDD. The voltage of the gate G of the first thin film transistor T1 is continuously reduced until it is equal to VRef+Vth since the gate G of the first thin film transistor T1 is continuously discharged by the first thin film transistor T1 and the third thin film transistor T3. VRef is the predetermined voltage value and Vth is the threshold voltage of the first thin film transistor T1. The first thin film transistor T1 is turned off, and the diode bias voltage Dbias is greater than VRef+Vth. Due to the storage effect of the storage capacitor C1, the voltage of the gate G of the first thin film transistor T1 is maintained at VRef+Vth.

Figure 6:
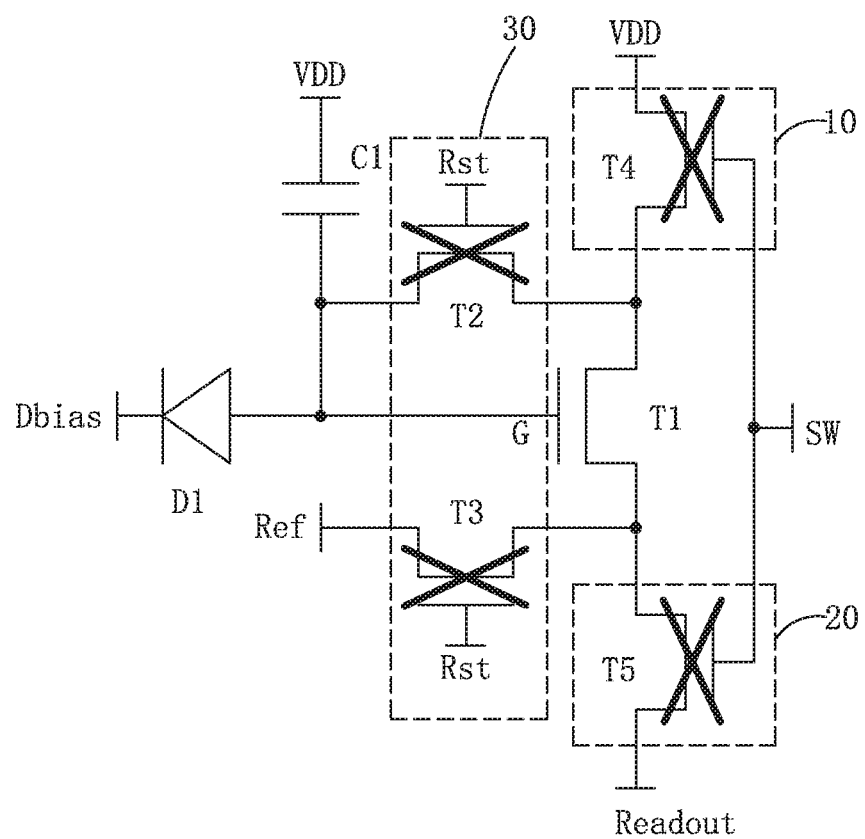
FIG. 6 is a schematic diagram of the optical fingerprint recognition circuit in an exposure stage according to the first embodiment of the disclosure.

Referring to FIG. 3 in combination with FIG. 6, in the exposure stage S3, the scan signal SW is at a low-potential level to control the fourth thin film transistor T4 and the fifth thin film transistor T5 to be turned off. The reset signal Rst is at a low-potential level to control the second thin film transistor T2 and the third thin film transistor T3 to be turned off. In this stage, the photodiode D1 is exposed by the light reflected by a finger to be performed a fingerprint recognition. The photodiode D1 receives a light signal at this time and generates a leakage current, so that the voltage of the gate G of the first thin film transistor T1 is increased to VRef+Vth+ΔV. ΔV is an increase amount of the voltage of the gate G of the first thin film transistor T1 caused by the leakage current of the photodiode D1 due to receiving the light signal. Under different light intensity conditions, the leakage current generated by the photodiode D1 is different. That is, the stronger the reflected light of the finger, the greater the leakage current generated by the photodiode D1. The increase amount ΔV of the voltage of the gate G of the first thin film transistor T1 caused by the leakage current of the photodiode D1 due to receiving the light signal is an amount related to the intensity of light reflected from the finger. Due to the storage effect of the storage capacitor C1, the voltage of the gate G of the first thin film transistor T1 is maintained at VRef+Vth+ΔV.

Figure 7:
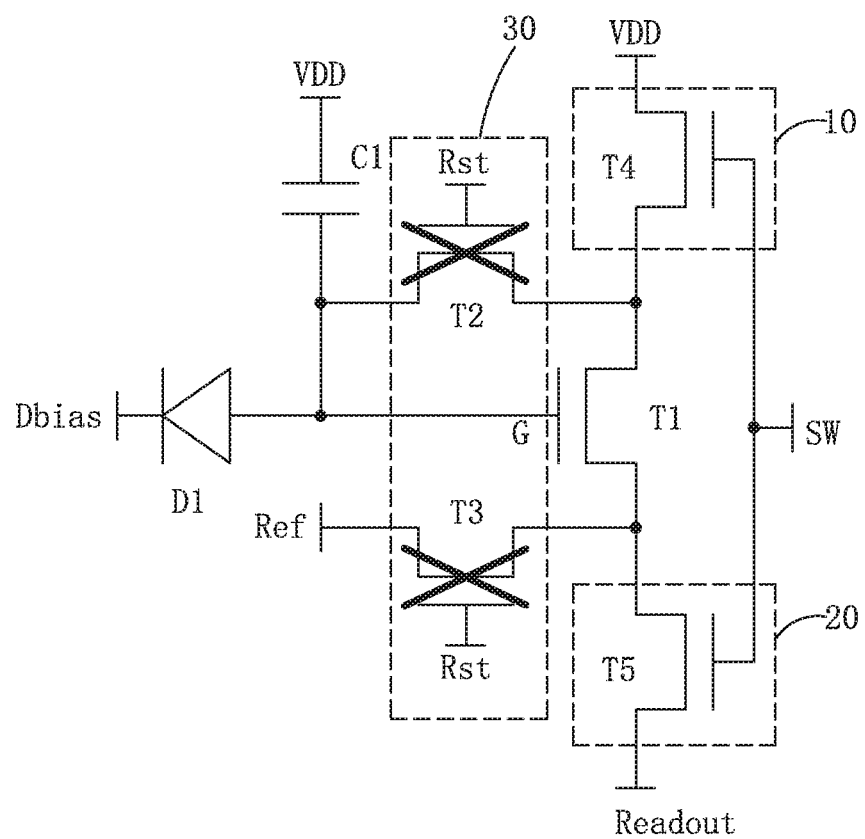
FIG. 7 is a schematic diagram of the optical fingerprint recognition circuit in a data reading stage according to the first embodiment of the disclosure.

Referring to FIG. 3 in combination with FIG. 7, in the data reading stage S4, the scan signal SW is at a high-potential level to control the fourth thin film transistor T4 and the fifth thin film transistor T5 to be turned on, the reset signal Rst is at a low-potential level to control the second thin film transistor T2 and the third thin film transistor T3 to be turned off. At this time, the voltage of the gate G of the first thin film transistor T1 is maintained at VRef+Vth+ΔV. The first thin film transistor T1 is turned on, and the first thin film transistor T1 generates a corresponding current according to the voltage of its gate G of the first thin film transistor to serve as a recognition signal and is transmitted to the signal transmission terminal Readout via the fifth thin film transistor T5 that has been turned on.

More specifically, in the first embodiment of the disclosure, the formula of the current passing through the first thin film transistor T1 is: $I=\frac{1}{2}\mu C_{ox}W/L(V_{gs}-V_{th})^2$.

I is the current flowing through the first thin film transistor T1, μ is the carrier mobility of the first thin film transistor T1, W and L are the channel width and channel length of the first thin film transistor T1, respectively, and Vgs is a voltage difference between the gate G and the source of the first thin film transistor T1. Besides, Vgs=VRef+Vth+ΔV−Vs, this formula is substituted into the above formula and the following formula can be obtained:

$$I=\frac{1}{2}\mu C_{ox}W/L(VRef+Vth+\Delta V-Vs-Vth)^2$$

$$=\frac{1}{2}\mu C_{ox}W/L(VRef+\Delta V-Vs)^2$$

It can be seen that the current flowing through the first thin film transistor T1 is independent of its own threshold voltage Vth. That is to say, the current finally transmitted to the signal transmission terminal Readout to serve as the recognition signal is independent of the threshold voltage of the first thin film transistor T1, so that the recognition signal is no longer affected by the threshold voltage of the first thin film transistor T1, and the accuracy is higher.

Figure 8:
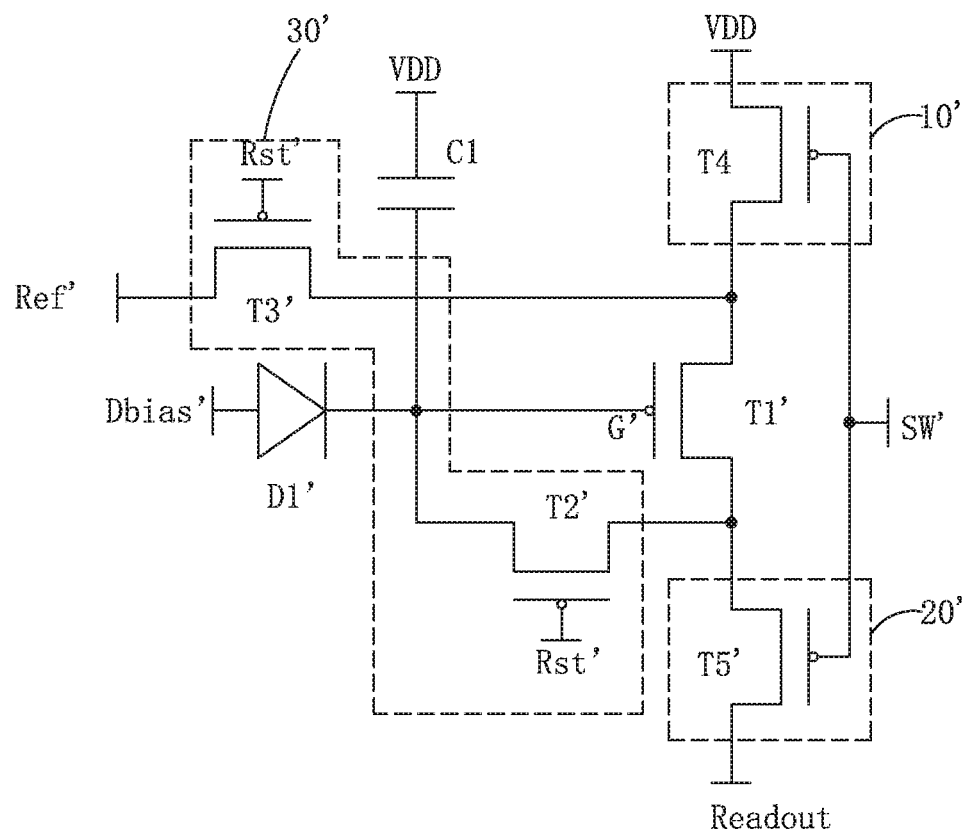
FIG. 8 is a circuit schematic diagram of an optical fingerprint recognition circuit according to a second embodiment of the disclosure.

Referring to FIG. 8, the difference between the optical fingerprint recognition circuit according to the second embodiment of the disclosure and the first embodiment is that a first thin film transistor T1', a second thin film transistor T2' of the reset compensation unit 30', a third thin film transistor T3', a fourth thin film transistor T4' of a first switching unit 10', and a fifth thin film transistors T5 of a second switching unit 10' are all P-type thin film transistors. Specifically, a gate of the second thin film transistor T2' is connected to receive a reset signal Rst', a source is electrically connected to a gate G' of the first thin film transistor T1', and a drain is electrically connected to the drain of the first thin film transistor T1'. A gate of the third thin film transistor T2' receives the reset signal Rst', a source receives a reference voltage Ref', and a drain is electrically connected to the source of the first thin film transistor T1'. A drain of the fourth thin film transistor T4' is electrically connected to the source of the first thin film transistor T1', and a source of the fifth thin film transistor T5' is electrically connected to the drain of the first thin film transistor T1'. Meanwhile, an anode of the photodiode D1' receives a diode bias Dbias', and a cathode is electrically connected to the gate G' of the first thin film transistor T1'.

Figure 9:
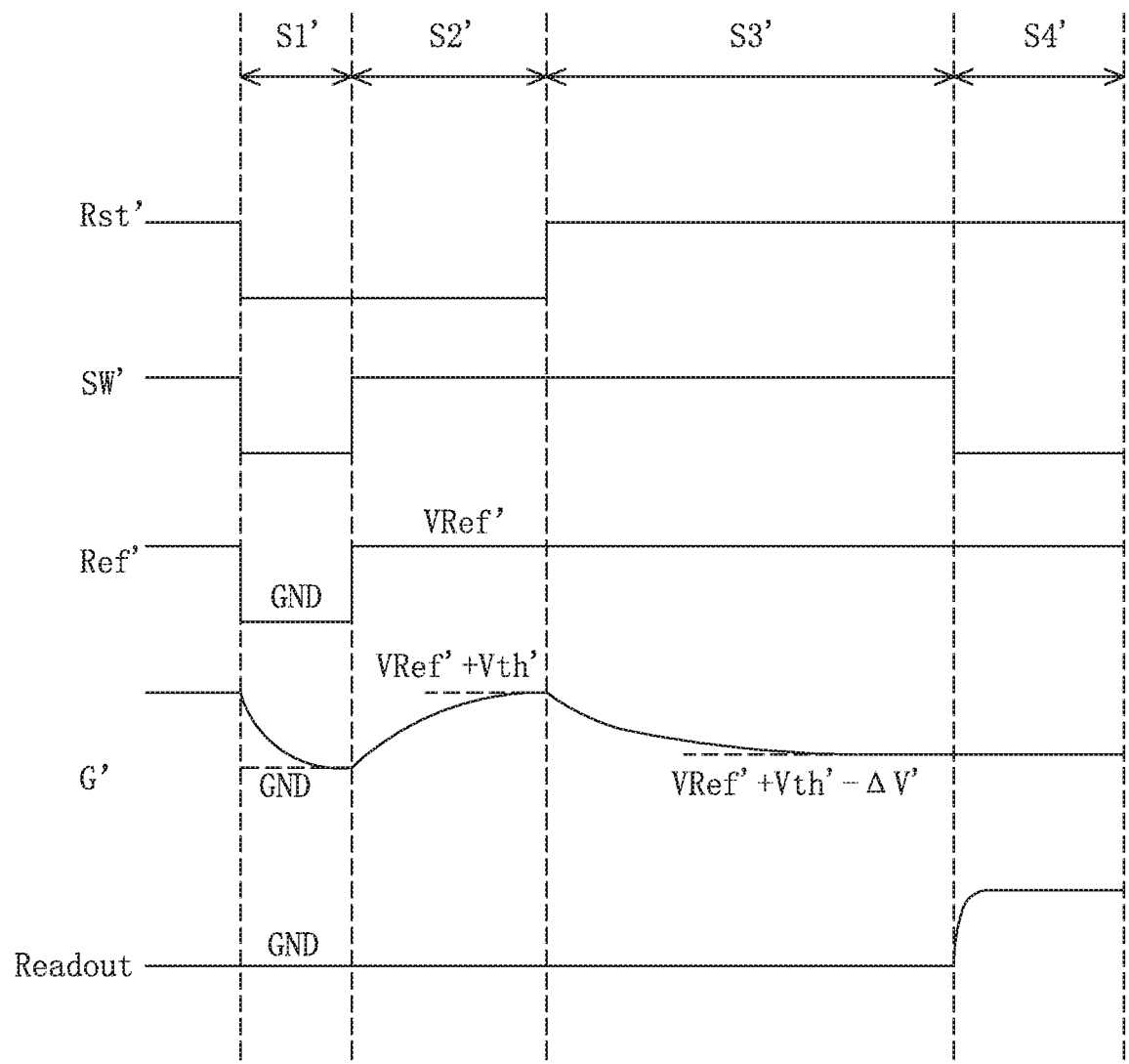
FIG. 9 is a timing schematic diagram of an optical fingerprint recognition circuit according to the second embodiment of the disclosure.

Accordingly, referring to FIG. 9, in a second embodiment of the disclosure, an operation process of the optical fingerprint recognition circuit further comprises a reset stage S1', a threshold compensation stage S2', an exposure stage S3', and a data reading stage in sequence S4'.

Figure 10:
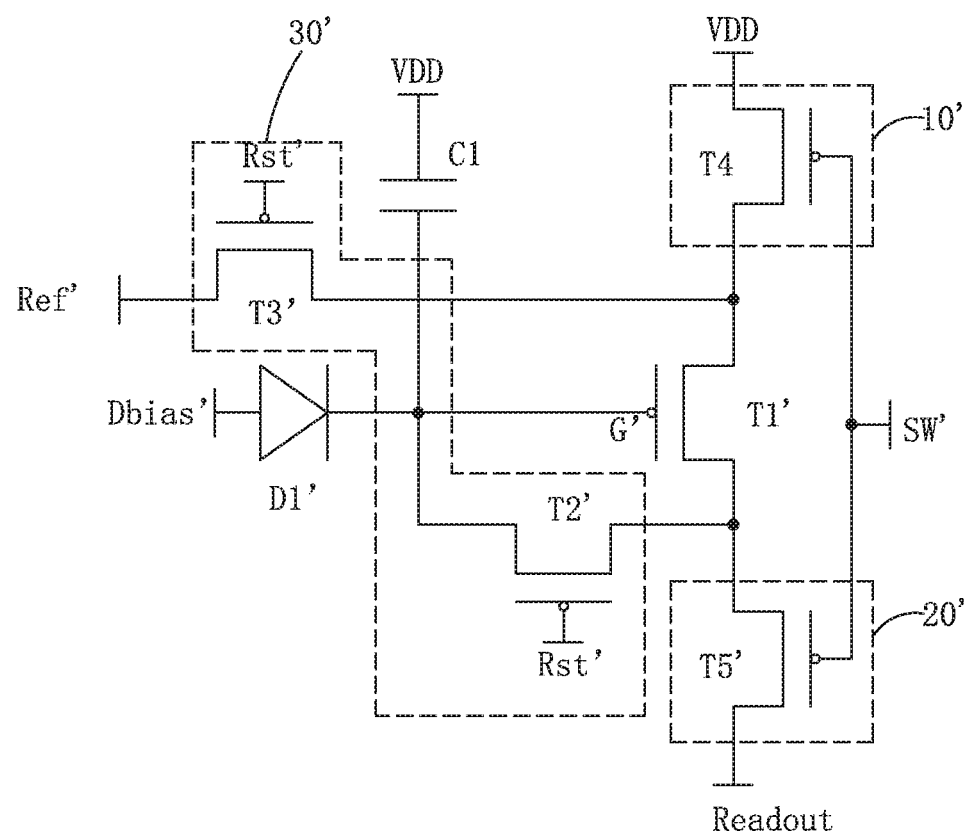
FIG. 10 is a schematic diagram of the optical fingerprint recognition circuit in a reset stage according to the second embodiment of the disclosure.

Referring to FIG. 9 in combination with FIG. 10, in the reset stage S1', the scan signal SW' is at a low-potential level to control the fourth thin film transistor T4' and the fifth thin-film transistor T5' to be turned on, the reset signal Rst' is at a low-potential level to control the second thin film transistor T2' and the third thin-film transistor T3' to be turned on. The signal transmission terminal Readout receives the ground terminal voltage GND. The ground terminal voltage GND can be provided by the processing chip. At this time, the gate G' of the first thin film transistor T1' is connected to receive the ground terminal voltage GND through the fifth thin film transistor T5' that has been turned on, so that the voltage of the gate G' of the first thin film transistor T1' is the ground terminal voltage GND. The gate G' of the first thin film transistor T1' is reset.

Preferably, in the reset stage S1', the voltage value of the reference voltage Ref' is equal to the ground terminal voltage GND, so as to prevent the problem of excessive current.

Figure 11:
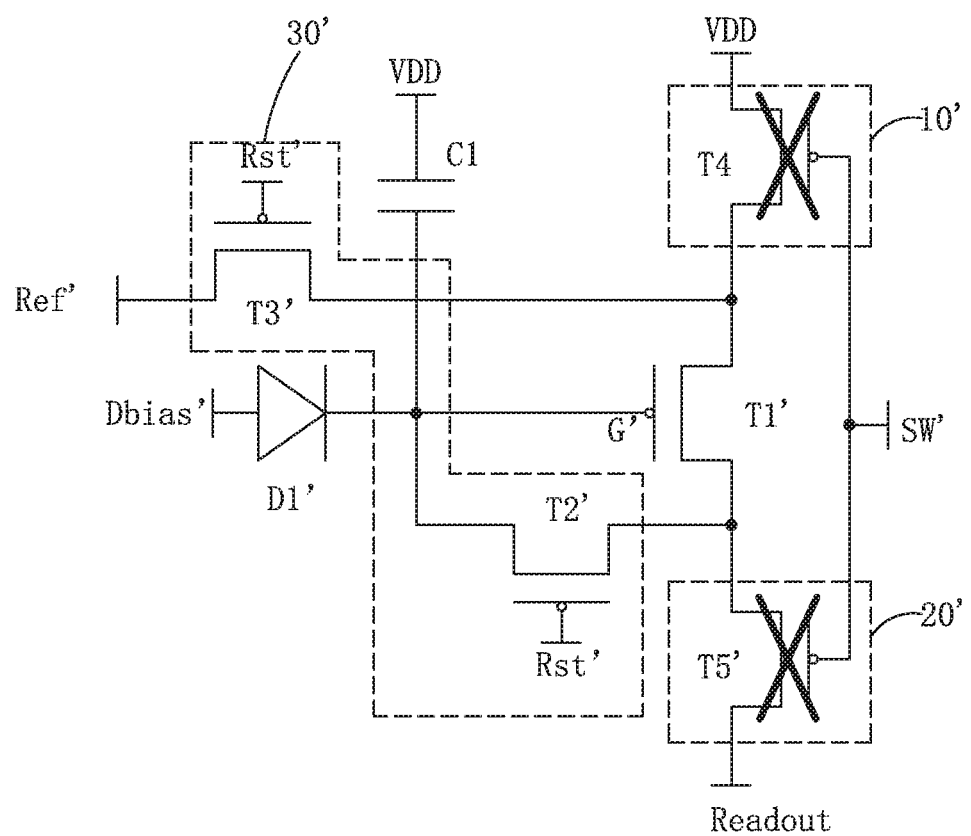
FIG. 11 is a schematic diagram of the optical fingerprint recognition circuit in a threshold compensation stage according to the second embodiment of the disclosure.

Referring to FIG. 9 in combination with FIG. 11, in the threshold compensation stage S2', the scan signal SW' is at a high-potential level to control the fourth thin film transistor T4' and the fifth thin film transistor T5' to be turned off, the reset signal Rst' is at a low-potential level to control the second thin film transistor T2' and the third thin film transistor T3' to be turned on. A voltage of the reference voltage Ref' is the predetermined voltage VRef, the predetermined voltage VRef is greater than the ground terminal voltage GND. The voltage of the gate G' of the first thin film transistor T1' is continuously increased until it is equal to VRef'+Vth' since the gate G' of the first thin film transistor T1' is continuously charged by the reference voltage Ref' through the second thin film transistor T2', the first thin film transistor T1' and the third thin film transistor T3' that have been turned on. VRef' is the predetermined voltage value, and Vth' is the threshold voltage of the first thin film transistor T1'. The first thin film transistor T1' is turned off, and the diode bias voltage Dbias is less than VRef'+Vth'. Due to the storage effect of the storage capacitor C1, the voltage of the gate G' of the first thin film transistor T1' is maintained at VRef'+Vth'.

Figure 12:
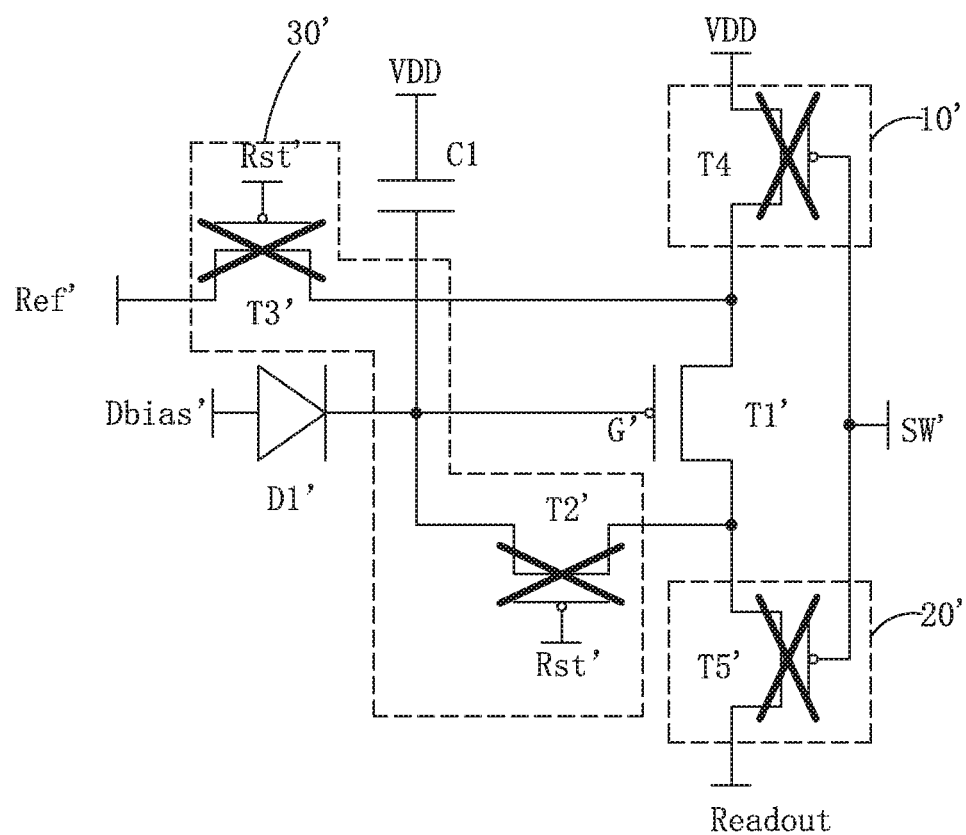
FIG. 12 is a schematic diagram of the optical fingerprint recognition circuit in an exposure stage according to the second embodiment of the disclosure.

Referring to FIG. 9 in combination with FIG. 12, in the exposure stage S3', the scan signal SW' is at a high-potential level to control the fourth thin film transistor T4' and the fifth thin film transistor T5' to be turned off. The reset signal Rst' is at a high-potential level to control the second thin film transistor T2' and the third thin film transistor T3' to be turned off. In this stage, the photodiode D1' is exposed by the light reflected by a finger to be performed a fingerprint recognition. The photodiode D1' receives a light signal at this time and generates a leakage current, so that the voltage of the gate G' of the first thin film transistor T1' is decreased to VRef'+Vth'−ΔV'. ΔV' is an decreasing amount of the voltage of the gate G' of the first thin film transistor T1' caused by the leakage current of the photodiode D1' due to receiving the light signal. Under different light intensity conditions, photodiode D1' comprises different leakage conditions. That is, the stronger the reflected light of the finger, the greater the leakage current generated by the photodiode D1'. The decreasing amount ΔV' of the voltage of the gate G' of the first thin film transistor T1' caused by the leakage current of the photodiode D1' due to receiving the light signal is an amount related to the intensity of light reflected from the finger. Due to the storage effect of the storage capacitor C1, the voltage of the gate G' of the first thin film transistor T1' is maintained at VRef'+Vth'−ΔV'.

Figure 13:
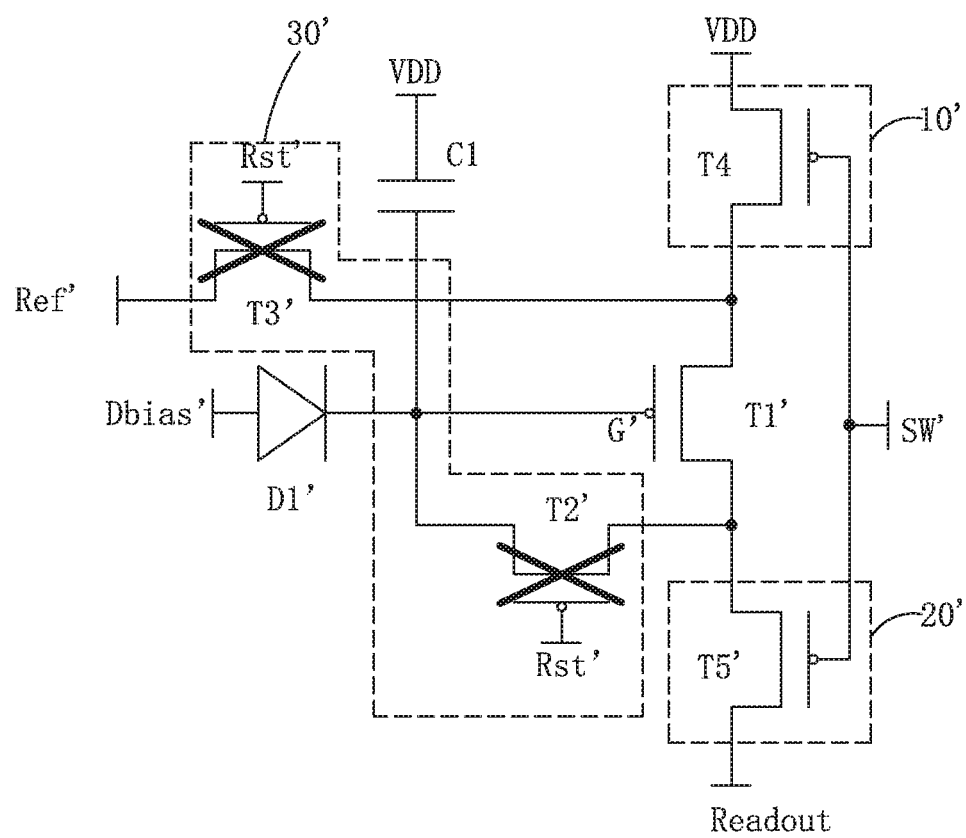
FIG. 13 is a schematic diagram of the optical fingerprint recognition circuit in a data reading stage according to the second embodiment of the disclosure.

Referring to FIG. 9 in combination with FIG. 13, in the data reading stage S4', the scan signal SW' is at a low-potential level to control the fourth thin film transistor T4' and the fifth thin film transistor T5' to be turned on, the reset signal Rst' is at a high-potential level to control the second thin film transistor T2' and the third thin film transistor T3' to be turned off. At this time, the voltage of the gate G' of the first thin film transistor T1' is maintained at VRef'+Vth'−ΔV'. The first thin film transistor T1' is turned on, and the first thin film transistor T1' generates a corresponding current according to the voltage of its gate G' of the first thin film transistor to serve as a recognition signal and is transmitted to the signal transmission terminal Readout via the fifth thin film transistor T5' that has been turned on.

More specifically, in the second embodiment of the disclosure, the formula of the current passing through the first thin film transistor T1' is:

$$I'=\tfrac{1}{2}\mu'CoxW'/L'(Vgs'-Vth')^2.$$

I' is the current flowing through the first thin film transistor T1', μ' is the carrier mobility of the first thin film transistor T1', W' and L' are the channel width and channel length of the first thin film transistor T1', respectively, and Vgs' is a voltage difference between the gate G' and the source of the first thin film transistor T1'. Besides, Vgs'=VRef'+Vth'−ΔV'−VDD, this formula is substituted into the above formula and the following formula can be obtained:

$$1 = 1/2\mu'CoxW'/L'(VRef + Vth' - \Delta V'Vth')^2$$
$$= 1/2\mu'CoxW'/L'(VDD - VRef' + \Delta V')^2.$$

It can be seen that the current flowing through the first thin film transistor T1' is independent of its own threshold voltage Vth'. That is to say, the current finally transmitted to the signal transmission terminal Readout as the recognition signal is independent of the threshold voltage of the first thin film transistor T1', so that the recognition signal is no longer affected by the threshold voltage of the first thin film transistor T1', and the accuracy is higher.

Based on the same inventive concept, the disclosure further provides a display device comprising the optical fingerprint recognition circuit described above, and the structure of the optical fingerprint recognition circuit is not described repeatedly here. The display device of the disclosure can compensate the threshold voltage of the first thin film transistor by disposing the optical fingerprint recognition circuit described above, the recognition signal is not affected by the threshold voltage of the first thin film transistor, and the accuracy of the recognition signal is ensured.

As mentioned above, the disclosure provides an optical fingerprint recognition circuit, which includes a first thin film transistor, a first switching unit, a second switching unit, a reset compensation unit, a storage capacitor and a photodiode. The reset compensation unit resets a voltage of the gate of the first thin film transistor under the control of a reset signal, and the voltage of the gate of the first thin film transistor is set to a sum of a predetermined voltage and a threshold voltage of the first thin film transistor through a reference voltage under the control of the reset signal, thereby compensating the threshold voltage of the first thin film transistor. After the photodiode receives the light signal and changes the voltage of the first thin film transistor according to the light signal, the first thin film transistor generates a corresponding current according to the voltage of its gate, which is independent of the threshold voltage of the first thin film transistor. Therefore, the accuracy of a recognition signal is ensured. The fingerprint recognition circuit of the display device of the disclosure can compensate the threshold voltage of the first thin film transistor to ensure the accuracy of the recognition signal.

This disclosure has been described with preferred embodiments thereof, and it is understood that many changes and modifications to the described embodiment can be carried out without departing from the scope and the spirit of the invention that is intended to be limited only by the appended claims.

What is claimed is:

1. An optical fingerprint recognition circuit, comprising a first thin film transistor, a first switching unit, a second switching unit, a reset compensation unit, a storage capacitor and a photodiode;
   wherein the first switching unit receives a scanning signal and a power supply voltage, and is configured to transmit the power supply voltage to one of a source and a drain of the first thin film transistor under the control of the scanning signal;
   wherein the second switching unit receives a scanning signal, and is configured to electrically connect the other of the source and the drain of the first thin film transistor with a signal transmission terminal under the control of the scanning signal;
   wherein one end of the storage capacitor is connected to receive the power supply voltage, and the other end of the storage capacitor is electrically connected to a gate of the first thin film transistor;
   wherein the reset compensation unit receives a reference voltage and a reset signal for resetting a voltage of the gate of the first thin film transistor under the control of the reset signal, and wherein the voltage of the gate of the first thin film transistor is set to a sum of a predetermined voltage value and a threshold voltage of the first thin film transistor through the reference voltage under the control of the reset signal; and
   wherein one of an anode and a cathode of the photodiode is connected to receive a diode bias voltage, and the other one of the anode and the cathode is electrically connected to the gate of the first thin film transistor for receiving a light signal and changing the voltage of the gate of the first thin film transistor correspondingly according to the light signal;
   wherein the first switching unit comprises a fourth thin film transistor, a gate of the fourth thin film transistor is connected to receive the scanning signal, a source of the fourth thin film transistor is connected to receive the power supply voltage, and a drain of the fourth thin film transistor is electrically connected to one of the source and the drain of the first thin film transistor;
   wherein the second switching unit comprises a fifth thin film transistor, a gate of the fifth thin film transistor is connected to receive the scanning signal, a source of the fifth thin film transistor is electrically connected to the other one of the source and the drain of the first thin film transistor, and a drain is electrically connected to the signal transmission terminal;
   wherein the reset compensation unit comprises a second thin film transistor and a third thin film transistor, a gate of the second thin film transistor is connected to receive the reset signal, a source of the second thin film transistor is electrically connected to the drain of the first thin film transistor, a drain of the second thin film transistor is electrically connected to the gate of the first the thin film transistor, a gate of the third thin film transistor is connected to receive the reset signal, a source of the third thin film transistor is connected to receive the reference voltage, a drain of the third thin film transistor is electrically connected to the source of the first thin film transistor, the drain of the fourth thin film transistor is electrically connected to the drain of the first thin film transistor, and the source of the fifth thin film transistor is electrically connected to the source of the first thin film transistor;
   wherein the first thin film transistor, the second thin film transistor, the third thin film transistor, the fourth thin film transistor, and the fifth thin film transistor are all N-type thin film transistors; and
   wherein the cathode of the photodiode is connected to receive the diode bias voltage, and the anode of the photodiode is electrically connected to the gate of the first thin film transistor.

2. The optical fingerprint recognition circuit according to claim 1, wherein an operation process of the optical fingerprint recognition circuit comprises a reset stage, a threshold compensation stage, an exposure stage, and a data reading stage in sequence;
   wherein in the reset stage, the scan signal is at a high-potential level to control the fourth thin film transistor and the fifth thin-film transistor to be turned on, the reset signal is at a high-potential level to control the second thin film transistor and the third thin-film transistor to be turned on, and the voltage of the first thin-film transistor is the power supply voltage;
   wherein in the threshold compensation stage, the scan signal is at a low-potential level to control the fourth thin film transistor and the fifth thin film transistor to be turned off, the reset signal is at a high-potential level to control the second thin film transistor and the third thin film transistor to be turned on, a voltage of the reference voltage is the predetermined voltage, the predetermined voltage is lower than the power supply voltage, the voltage of the gate of the first thin film transistor is continuously reduced until it is equal to VRef+Vth, and wherein VRef is the predetermined voltage value and Vth is the threshold voltage of the first thin film transistor, the diode bias voltage is greater than VRef+Vth;
   wherein in the exposure stage, the scan signal is at a low-potential level to control the fourth thin film transistor and the fifth thin film transistor to be turned off, the reset signal is at a low-potential level to control the second thin film transistor and the third thin film transistor to be turned off, the photodiode receives the light signal and produce leakage current, so that the voltage of the gate of the first thin film transistor is increased to VRef+Vth+ΔV, and wherein ΔV is an increase amount of the voltage of the gate of the first thin film transistor caused by the leakage current of the photodiode due to receiving a light signal;

wherein in the data reading stage, the scan signal is at a high-potential level to control the fourth thin film transistor and the fifth thin film transistor to be turned on, the reset signal is at a low-potential level to control the second thin film transistor and the third thin film transistor to be turned off, the first thin film transistor generates a corresponding current according to the voltage of the gate of the first thin film transistor, so that the corresponding current is transmitted to the signal transmission terminal through the fifth thin film transistor that is turned on.

3. The optical fingerprint recognition circuit according to claim 2, wherein in the reset stage, a voltage value of the reference voltage is equal to a voltage value of the power supply voltage.

4. The optical fingerprint recognition circuit according to claim 1, wherein the first thin film transistor, the second thin film transistor, the third thin film transistor, the fourth thin film transistor, and the fifth thin film transistor are all LTPS thin film transistors.

5. A display device, comprising an optical fingerprint recognition circuit according to claim 1.

6. An optical fingerprint recognition circuit, comprising a first thin film transistor, a first switching unit, a second switching unit, a reset compensation unit, a storage capacitor and a photodiode;

wherein the first switching unit receives a scanning signal and a power supply voltage, and is configured to transmit the power supply voltage to one of a source and a drain of the first thin film transistor under the control of the scanning signal;

wherein the second switching unit receives a scanning signal, and is configured to electrically connect the other of the source and the drain of the first thin film transistor with a signal transmission terminal under the control of the scanning signal;

wherein one end of the storage capacitor is connected to receive the power supply voltage, and the other end of the storage capacitor is electrically connected to a gate of the first thin film transistor;

wherein the reset compensation unit receives a reference voltage and a reset signal for resetting a voltage of the gate of the first thin film transistor under the control of the reset signal, and wherein the voltage of the gate of the first thin film transistor is set to a sum of a predetermined voltage value and a threshold voltage of the first thin film transistor through the reference voltage under the control of the reset signal; and wherein one of an anode and a cathode of the photodiode is connected to receive a diode bias voltage, and the other one of the anode and the cathode is electrically connected to the gate of the first thin film transistor for receiving a light signal and changing the voltage of the gate of the first thin film transistor correspondingly according to the light signal;

wherein the first switching unit comprises a fourth thin film transistor, a gate of the fourth thin film transistor is connected to receive the scanning signal, a source of the fourth thin film transistor is connected to receive the power supply voltage, and a drain of the fourth thin film transistor is electrically connected to one of the source and the drain of the first thin film transistor;

wherein the second switching unit comprises a fifth thin film transistor, a gate of the fifth thin film transistor is connected to receive the scanning signal, a source of the fifth thin film transistor is electrically connected to the other one of the source and the drain of the first thin film transistor, and a drain is electrically connected to the signal transmission terminal;

wherein the reset compensation unit comprises a second thin film transistor and a third thin film transistor, a gate of the second thin film transistor is connected to receive the reset signal, a source of the second thin film transistor is electrically connected to a gate of the first thin film transistor, a drain of the second thin film transistor is electrically connected to the drain of the first thin film transistor, a gate of the third thin film transistor is connected to receive a reset signal, a source of the third thin film transistor is connected to receive the reference voltage, a drain of the third thin film transistor is electrically connected to the source of the first thin film transistor, a drain of the fourth thin film transistor is electrically connected to the source of the first thin film transistor, and the source of the fifth thin film transistor is electrically connected to the drain of the first thin film transistor;

wherein the first thin film transistor, the second thin film transistor, the third thin film transistor, the fourth thin film transistor, and the fifth thin film transistor are all P-type thin film transistors; and wherein the anode of the photodiode is connected to receive a diode bias voltage, and the cathode of the photodiode is electrically connected to the gate of the first thin film transistor.

7. The optical fingerprint recognition circuit according to claim 6, wherein an operation process of the optical fingerprint recognition circuit comprises a reset stage, a threshold compensation stage, an exposure stage, and a data reading stage in sequence;

wherein in the reset stage, the scan signal is at a high-potential level to control the fourth thin film transistor and the fifth thin-film transistor to be turned on, the reset signal is at a high-potential level to control the second thin film transistor and the third thin-film transistor to be turned on, the signal transmission terminal is connected to receive a ground terminal voltage, and the voltage of the first thin-film transistor is the ground terminal voltage;

wherein in the threshold compensation stage, the scan signal is at a high-potential level to control the fourth thin film transistor and the fifth thin film transistor to be turned off, the reset signal is at a low-potential level to control the second thin film transistor and the third thin film transistor to be turned on, a voltage of the reference voltage is the predetermined voltage, the predetermined voltage is greater than the ground terminal voltage, the voltage of the gate of the first thin film transistor is continuously increased until it is equal to VRef'+Vth', and wherein the VRef' is the predetermined voltage value and the Vth' is the threshold voltage of the first thin film transistor, the diode bias voltage is less than VRef'+Vth';

wherein in the exposure stage, the scan signal is at a high-potential level to control the fourth thin film transistor and the fifth thin film transistor to be turned off, the reset signal is at a high-potential level to control the second thin film transistor and the third thin film transistor to be turned off, the photodiode receives the light signal and produce leakage current, so that the voltage of the gate of the first thin film transistor is reduced to VRef'+Vth'−ΔV', and wherein ΔV' is an reduction amount of the voltage of the gate of the first thin film transistor caused by the leakage current of the photodiode due to receiving a light signal;

wherein in the data reading stage, the scan signal is at a low-potential level to control the fourth thin film transistor and the fifth thin film transistor to be turned on, the reset signal is at a high-potential level to control the second thin film transistor and the third thin film transistor to be turned off, the first thin film transistor generates a corresponding current to be transmitted to the signal transmission terminal through the fifth thin film transistor that is turned on according to the voltage of the gate of the fifth thin film transistor.

8. The optical fingerprint recognition circuit according to claim 7, wherein in the reset stage, a voltage value of the reference voltage is equal to a voltage value of the ground terminal voltage.

\* \* \* \* \*